United States Patent
Chen et al.

(10) Patent No.: US 7,152,666 B2
(45) Date of Patent: Dec. 26, 2006

(54) HEAT SINK

(75) Inventors: Chun-Chi Chen, Tu-chen (TW);
Jianjun Zhang, Shenzhen (CN)

(73) Assignees: Hong Fu Jin Precision Industry (Shenzhen) Co., Ltd., Shenzhen (CN);
Hon Hai Precision Industry Co., Ltd., Tu-Cheng (TW)

( * ) Notice: Subject to any disclaimer, the term of this patent is extended or adjusted under 35 U.S.C. 154(b) by 153 days.

(21) Appl. No.: 10/921,404

(22) Filed: Aug. 18, 2004

(65) Prior Publication Data

US 2005/0103471 A1  May 19, 2005

(30) Foreign Application Priority Data

Nov. 14, 2003 (CN) .................. 2003 2 01182894

(51) Int. Cl.
*H05K 7/20* (2006.01)
(52) U.S. Cl. ........................... 165/80.3; 361/704
(58) Field of Classification Search ............. 165/80.3, 165/185; 361/704, 710
See application file for complete search history.

(56) References Cited

U.S. PATENT DOCUMENTS

| | | | | |
|---|---|---|---|---|
| 4,823,869 A | * | 4/1989 | Arnold et al. ............. | 165/185 |
| 5,582,240 A | * | 12/1996 | Widmayer ................. | 165/80.3 |
| 6,199,624 B1 | * | 3/2001 | Wotring .................... | 165/80.3 |
| 6,418,020 B1 | | 7/2002 | Lin | |
| 6,598,667 B1 | * | 7/2003 | Kuo .......................... | 165/80.3 |
| 6,735,864 B1 | * | 5/2004 | Sato et al. ................ | 29/890.03 |
| D491,260 S | * | 6/2004 | Luo ........................... | D23/411 |
| 6,899,164 B1 | * | 5/2005 | Li et al. .................... | 165/80.3 |
| D511,326 S | * | 11/2005 | Watanabe et al. ......... | D13/179 |
| 2003/0196780 A1 | * | 10/2003 | Hegde ....................... | 165/80.3 |
| 2003/0209342 A1 | * | 11/2003 | Hsin et al. ................ | 165/80.3 |
| 2004/0035554 A1 | * | 2/2004 | Sato et al. ................ | 165/80.3 |
| 2004/0194923 A1 | * | 10/2004 | Chu .......................... | 165/80.3 |

FOREIGN PATENT DOCUMENTS

| TW | 474559 | 1/2002 |
|---|---|---|
| TW | 479819 | 3/2002 |

* cited by examiner

*Primary Examiner*—Allen J. Flanigan
(74) *Attorney, Agent, or Firm*—Wei Te Chung

(57) ABSTRACT

A heat sink includes a body (10) having two pairs of sections intercrossed at a central portion thereof to form a cross profile when viewed from a top of the body. Each section includes a top surface (12), a bottom surface (14), a vertical surface (16) and a guiding surface (18) opposing the vertical surface. The vertical surface and the guiding surface are extended between the top and bottom surfaces. A thickness of each section increases gradually from the top surface to the bottom surface. A plurality of spaced fins (30) extend from the guiding surface of each of the sections in directions perpendicular to the vertical surface of the corresponding section. Each section has a stand protruding downwardly from the bottom surface adjacent the central portion of the body. The stands of the sections cooperatively form a heat receiving portion (20) for contacting with a heat generating component.

14 Claims, 3 Drawing Sheets

HEAT SINK

BACKGROUND OF THE INVENTION

1. Field of the Invention

The present invention relates to a heat sink for electronic components, and particularly to a heat sink having a plurality of guiding surfaces.

2. Related Art

Electronic devices such as central processing units (CPUs) generate a lot of heat during normal operation. This can deteriorate their operational stability and damage associated electronic devices. Thus the heat must be removed quickly to ensure normal operation. A heat sink is often attached to a top surface of a CPU, to remove heat therefrom.

A conventional heat sink comprises a rectangular base and a plurality fins arranged on the base. The base is used to contact a CPU for absorbing heat therefrom. A fan is often attached on the fins of the heat sink for producing cool air flow through the fins to enhance heat dissipation efficiency of the heat sink. However, due to a central core of the fan is solid and located above a central portion of the heat sink cool air from the fan cannot be brown to the central portion of the heat sink where most of heat generated by the CPU is accumulated, thereby decreasing effect of heat dissipation of the heat sink.

Another improved conventional heat sink employs a base with a pair of inclined upper surfaces for guiding cool air to a central portion of the base. Effect of the heat dissipation of such heat sink is improved compared with the prior conventional heat sink. However, all fins of such heat sink are extended in the same direction and parallel to each other, while cool air of the fan blows in a spiral direction. Most channels between the fins are not consistent with the air flow of the fan. Cool air cannot be blown to the fins effectively. Effect of heat dissipation of the heat sink is therefore decreased.

SUMMARY OF THE INVENTION

Accordingly, an object of the present invention is to provide a heat sink which has guiding surfaces consistent with cool air flow of a fan attached on the heat sink.

To achieve the above-mentioned object, a heat sink in accordance with the present invention comprises a body having two pairs of sections intercrossed at a central portion thereof to form a cross profile when viewed from a top surface of the body. Each section comprises a top surface, a bottom surface, a vertical surface and a guiding surface opposing the vertical surface. The vertical surface and the guiding surface extend between the top and bottom surfaces. A thickness of each section increases gradually from the top surface to the bottom surface thereof. A plurality of spaced fins extend from the guiding surface of each of the sections in directions perpendicular to the vertical surface of the corresponding section. Each section comprises a stand protruding downwardly from the bottom surface adjacent the central portion of the body. The stands of the sections cooperatively form a heat receiving portion for contacting with a heat generating component.

Other objects, advantages and novel features of the present invention will be drawn from the following detailed description of a preferred embodiment of the present invention with attached drawings, in which:

DETAILED DESCRIPTION OF THE INVENTION

Figure 1:
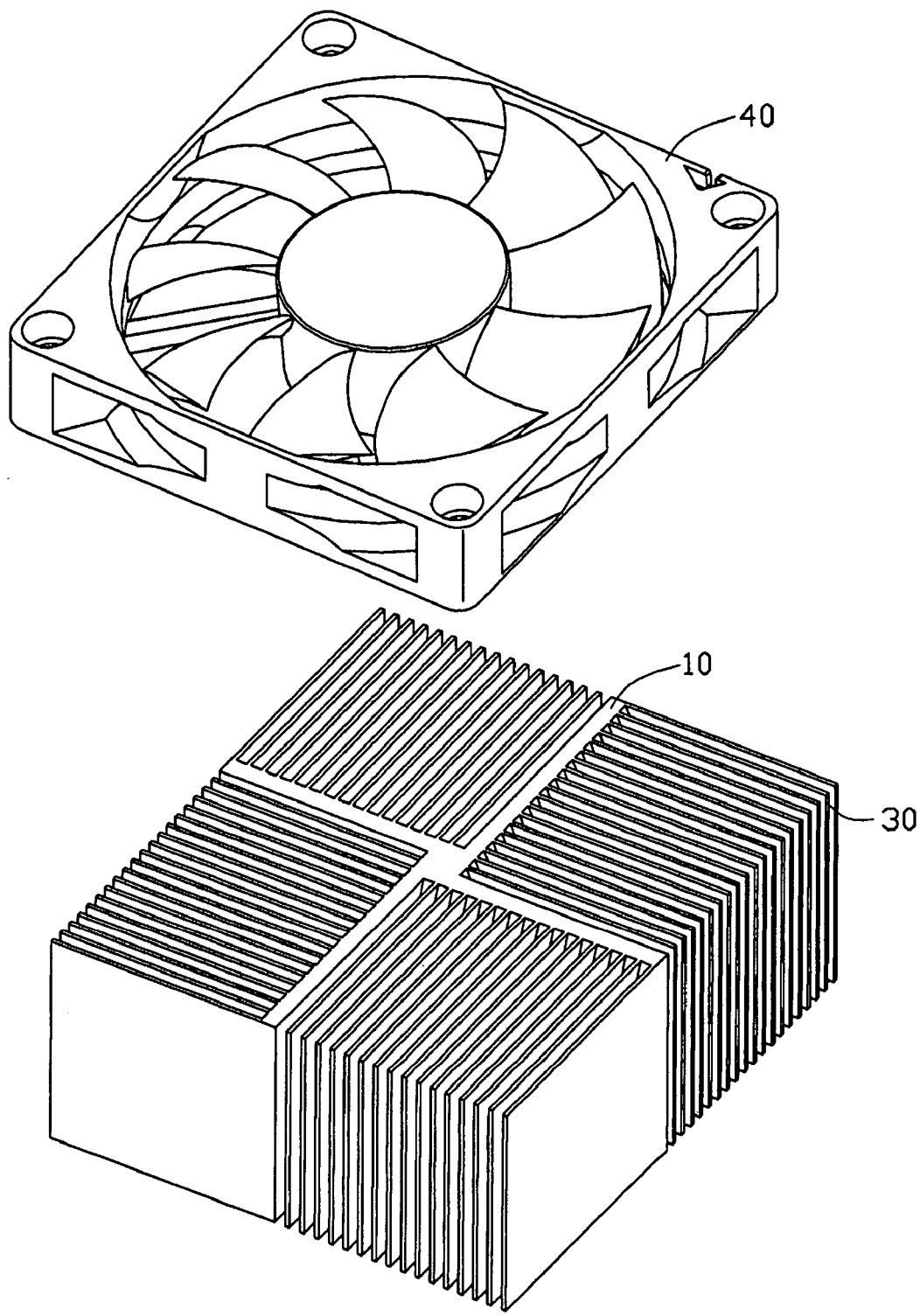
FIG. 1 is an isometric view of a heat sink in accordance with a preferred embodiment of the present invention, together with a fan.
Figure 2:
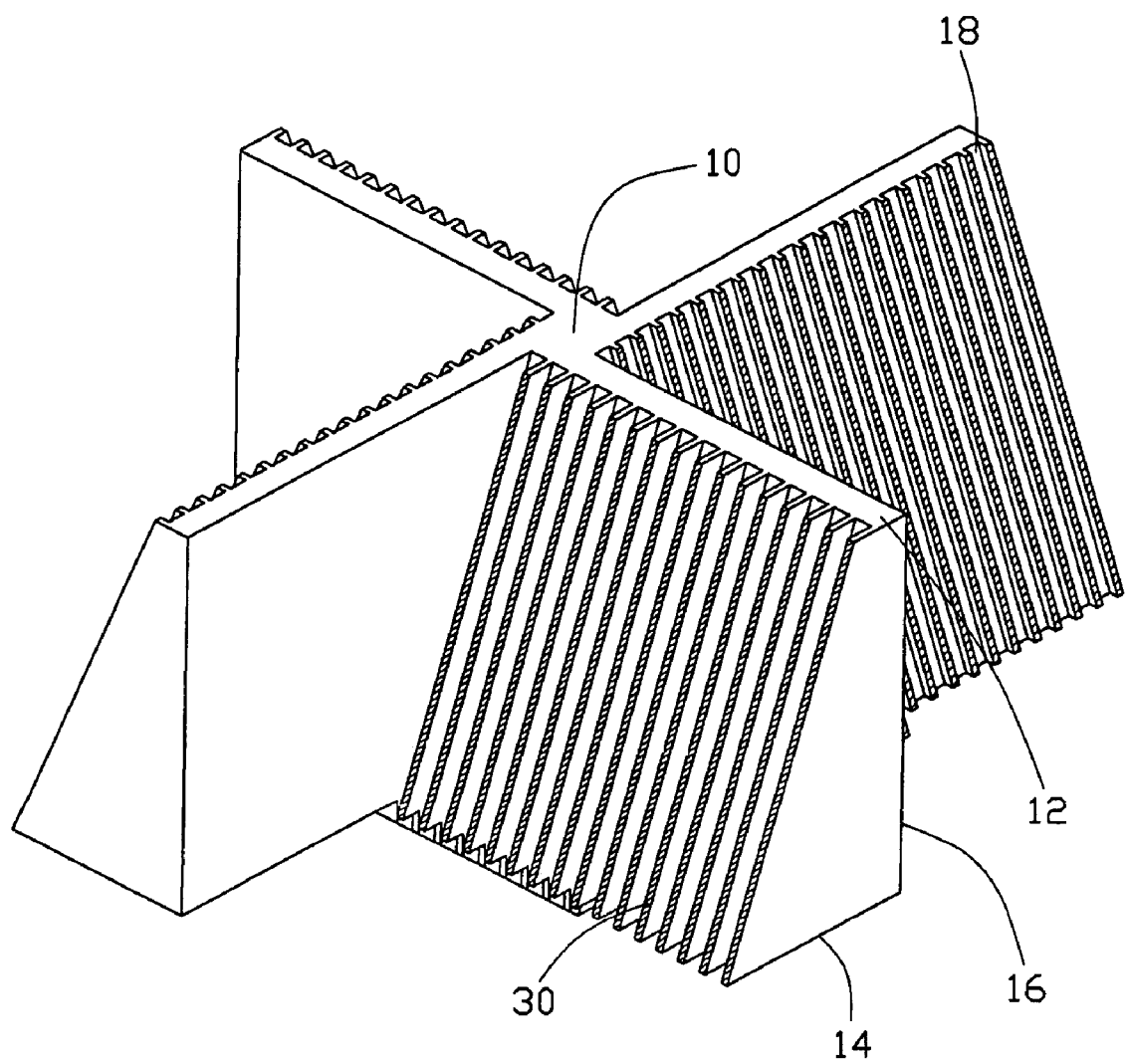
FIG. 2 is a partly cutaway view of the heat sink of FIG. 1.
Figure 3:
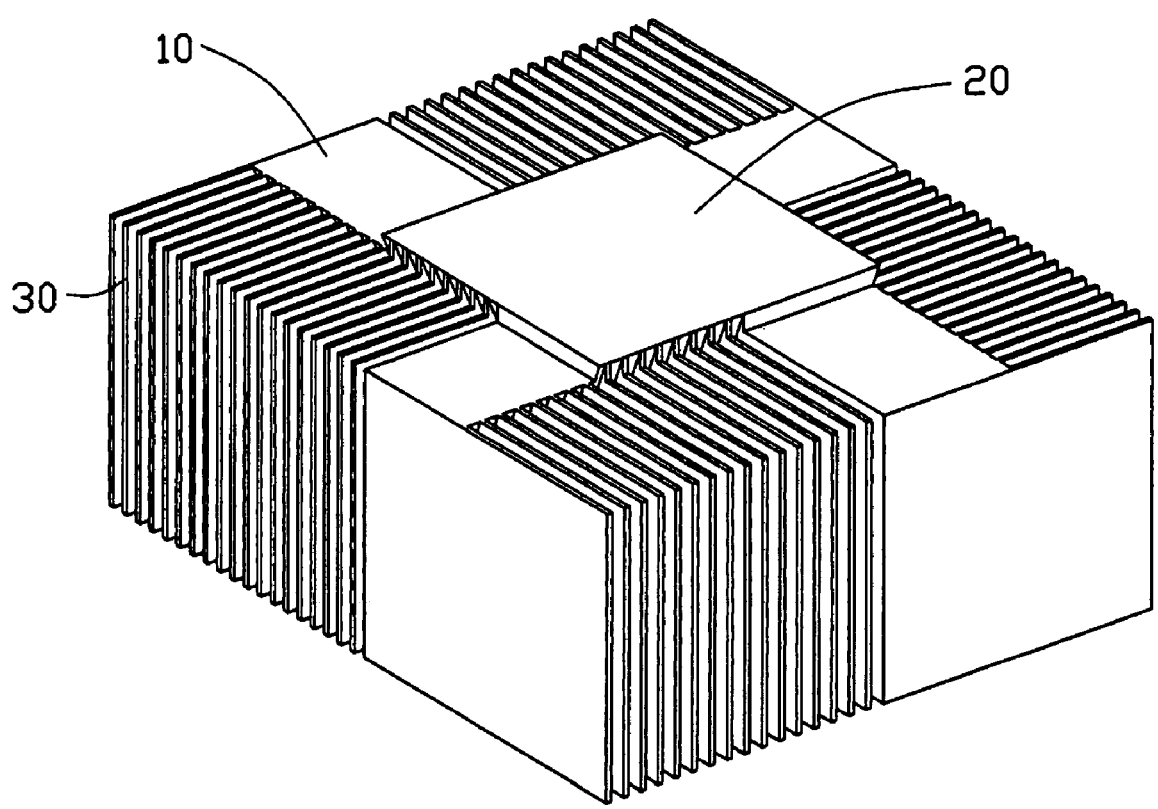
FIG. 3 is an isometric view of the heat sink of FIG. 1, but shown inverted.

Referring to FIGS. 1–3, a heat sink in accordance with a preferred embodiment of the present invention comprises a body 10 and a plurality of fins 30. A fan 40 can be attached on a top of the heat sink for producing cool air flow through the heat sink to enhance effect of heat dissipation of the heat sink.

The body 10 comprises four sections intercrossing with each other at a central portion of the body 10 cooperatively forming a cross profile when viewed from a top of the body 10. Each section comprises a top surface 12, a bottom surface 14, a vertical surface 16 and a guiding surface 18 opposing the vertical surface 16. The vertical surface 16 and the guiding surface 18 are respectively extended between the top surface 12 and the bottom surface 14. The vertical surface 16 is perpendicular to the top and bottom surfaces 12, 14. Each section has a trapezoid cross-section perpendicular to a direction in which the section extends from the central portion of the body 10. A thickness of each section increases gradually from the top surface 12 to the bottom surface 14. Each section comprises a stand protruding downwardly from the bottom surface 14 adjacent the central portion of the body 10. The stands of the sections cooperatively form a flat heat receiving portion 20 for contacting with a heat generating component (not shown).

The fins 30 spacedly extend from the guiding surfaces 18 of the sections in directions perpendicular to the vertical surfaces 16 of the corresponding sections. The directions in which the fins 30 extends from the guiding surfaces 18 cooperatively form a closed polygon. The fins 30 which extend from the same section are parallel to each other. A plurality of air channels is formed between adjacent fins 30.

In the preferred embodiment of the present invention, the guiding surfaces 18 are inclined surfaces, such as: concave arc surfaces, convex arc surfaces or flat straight surfaces.

In the present invention, the guiding surfaces 18 and the air channels of the heat sink are generally consistent with air flow from the fan 40. In operation, cool air from the fan 40 can be guided to the central portion of the heat sink and the fins 30 effectively, thereby improving heat dissipation of the heat sink.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat sink comprising:
   a body comprising a plurality of sections intercrossing with each other, each section having a thickness varied along a direction from a top surface to a bottom surface of the body; and
   a plurality of spaced fins extending from surfaces of the sections between the top and bottom surfaces in directions cooperatively forming a closed polygon.

2. The heat sink as claimed in claim 1, wherein the surfaces of the sections having the fins extending therefrom are inclined surfaces extending between the top surface and the bottom surface of the body.

3. The heat sink as claimed in claim 2, wherein each section comprises a stand protruding downwardly therefrom, the stands of the body cooperatively forming a rectangular heat receiving portion.

4. The heat sink as claimed in claim 2, wherein the thickness of each section increases gradually in a direction from the top surface to the bottom surface.

5. The heat sink as claimed in claim 2, wherein each section further comprises a surface opposing the inclined surface and perpendicular to the top and bottom surfaces of the body.

6. A heat sink assembly comprising:
  a heat sink comprising a body having a top surface, a bottom surface, a plurality of guiding surfaces formed between the top and bottom surfaces, a plurality of spaced parallel fins extending from each of the guiding surfaces, air channels being formed between adjacent fins; and
  a fan mounted in the heat sink, wherein
  the guiding surfaces and the air channels are generally consistent with air flow from the fan;
  wherein the body comprises a plurality of sections intercrossing with each other to form a cross profile when viewed from the top surface of the body;
  wherein each section comprises a stand protruding downwardly therefrom adjacent a central portion of the body, the stands of the sections cooperatively forming a flat heat receiving portion.

7. The heat sink assembly as claimed in claim 6, wherein the guiding surfaces are formed on the sections respectively.

8. The heat sink assembly as claimed in claim 6, wherein the guiding surfaces are inclined surface.

9. The heat sink assembly as claimed in claim 8, wherein a thickness of each section increases gradually in a direction from the top surface to the bottom surface.

10. A heat sink comprising:
  a body comprising a plurality of sections intercrossing with one another about a center portion of the body, each section having a narrow top face and a wide bottom face; and
  a set of spaced parallel fins extending from each of said sections, the sets of fins of all said sections arranged with one another either commonly clockwise or commonly counterclockwise, this cooperatively forming a polygonal contour;
  wherein, said wide bottom faces of said sections commonly define a large region for contacting a heat generating device.

11. The heat sink assembly as claimed in claim 10, wherein said narrow top faces of said sections commonly define a small region for confronting a fan.

12. The heat sink assembly as claimed in claim 10, wherein each of said sections defines a vertical plane and a slanted plane, an wherein a vertical plane defines a vertical plane and a slanted plane, and wherein a vertical plane confronts the set of fins of the neighboring section while the slanted plane confronts the set of fins of the corresponding section which said slanted plane belongs to.

13. The heat sink assembly as claimed in claim 10, wherein for a region between a periphery of the polygonal contour and the large region, the sets of fins define a plurality of channels extending therethrough in a vertical direction.

14. The heat sink assembly as claimed in claim 10, wherein the large region extends beyond the other portions in a vertical direction.

* * * * *